(12) United States Patent
Marks et al.

(10) Patent No.: US 7,271,107 B2
(45) Date of Patent: Sep. 18, 2007

(54) REDUCTION OF FEATURE CRITICAL DIMENSIONS USING MULTIPLE MASKS

(75) Inventors: Jeffrey Marks, San Jose, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 15 days.

(21) Appl. No.: 11/050,985

(22) Filed: Feb. 3, 2005

(65) Prior Publication Data

US 2006/0172540 A1   Aug. 3, 2006

(51) Int. Cl.
*H01L 21/311* (2006.01)

(52) U.S. Cl. ............... 438/717; 438/702; 257/E21.548

(58) Field of Classification Search ............... 438/700, 438/702, 717; 257/E21.548
See application file for complete search history.

(56) References Cited

U.S. PATENT DOCUMENTS

| | | | | |
|---|---|---|---|---|
| 4,707,218 A | * | 11/1987 | Giammarco et al. | 438/421 |
| 4,801,350 A | * | 1/1989 | Mattox et al. | 438/702 |
| 4,838,991 A | * | 6/1989 | Cote et al. | 216/46 |
| 4,857,477 A | * | 8/1989 | Kanamori | 438/386 |
| 5,459,099 A | | 10/1995 | Hsu | |
| 5,654,238 A | * | 8/1997 | Cronin et al. | 438/700 |
| 5,874,359 A | * | 2/1999 | Liaw et al. | 438/640 |
| 5,895,740 A | * | 4/1999 | Chien et al. | 430/313 |
| 5,981,148 A | | 11/1999 | Brown et al. | |
| 6,183,937 B1 | | 2/2001 | Tsai et al. | |
| 6,416,933 B1 | | 7/2002 | Singh et al. | |
| 6,528,238 B1 | | 3/2003 | Seniuk et al. | |
| 6,528,372 B2 | * | 3/2003 | Lukanc et al. | 438/286 |
| 6,589,713 B1 | * | 7/2003 | Okoroanyanwu | 430/313 |
| 6,610,607 B1 | | 8/2003 | Armbrust et al. | |

(Continued)

FOREIGN PATENT DOCUMENTS

| | | |
|---|---|---|
| DE | 10223249 | 12/2003 |
| EP | JP05088375 | 4/1993 |

OTHER PUBLICATIONS

U.S. Appl. No. 11/126,466, entitled "Reticle Alignment and Overlay for Multiple Reticle Process", by inventors Sadjadi et al., filed May 10, 2005.

(Continued)

*Primary Examiner*—Michelle Estrada
*Assistant Examiner*—Jarrett J Stark
(74) *Attorney, Agent, or Firm*—Beyer Weaver LLP

(57) ABSTRACT

A method for forming features in an etch layer is provided. A first mask is formed over the etch layer wherein the first mask defines a plurality of spaces with widths. A sidewall layer is formed over the first mask. Features are etched into the etch layer through the sidewall layer, wherein the features have widths that are smaller than the widths of the spaces defined by the first mask. The mask and sidewall layer are removed. An additional mask is formed over the etch layer wherein the additional mask defines a plurality of spaces with widths. A sidewall layer is formed over the additional mask. Features are etched into the etch layer through the sidewall layer, wherein the widths that are smaller than the widths of the spaces defined by the first mask. The mask and sidewall layer are removed.

21 Claims, 15 Drawing Sheets

U.S. PATENT DOCUMENTS

| | | |
|---|---|---|
| 6,665,856 B1 | 12/2003 | Pierrat et al. |
| 6,955,961 B1 | 10/2005 | Chung |
| 2002/0071997 A1 | 6/2002 | Ahrens et al. |
| 2002/0182549 A1 | 12/2002 | Chang et al. |
| 2003/0073298 A1 | 4/2003 | Gonzalez et al. |
| 2003/0232509 A1 | 12/2003 | Chung et al. |
| 2004/0048170 A1 | 3/2004 | Pierrat et al. |
| 2004/0180267 A1 | 9/2004 | Tejnil |
| 2004/0229135 A1 | 11/2004 | Wang et al. |
| 2005/0048785 A1 | 3/2005 | Kang et al. |
| 2005/0070111 A1 | 3/2005 | Kushibiki et al. |
| 2005/0081178 A1 | 4/2005 | Sivakumar et al. |
| 2006/0011575 A1* | 1/2006 | Chung et al. .......... 216/41 |

OTHER PUBLICATIONS

U.S. Appl. No. 11/126,708, entitled "Computer Readable Mask Shrink Control Processor", by inventors Sadjadi et al., filed May 10, 2005.

U.S. Appl. No. 11/170,273, entitled "Multiple Mask Process with Etch Mask Stack", by inventor S.M. Reza Sadjadi, filed Jun. 28, 2005.

International Search Report and Written Opinion, mailed Jun. 23, 2006.

* cited by examiner

REDUCTION OF FEATURE CRITICAL DIMENSIONS USING MULTIPLE MASKS

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARL (Anti-reflective layer) 110 over the layer 108 to be etched forming a stack 100. The photoresist pattern has a critical dimension (CD), which may be the width 116 of the smallest feature. Due to optical properties dependent on wavelength, photoresist exposed by longer wavelength light has larger theoretical minimal critical dimensions.

A feature 120 may then be etched through the photoresist pattern, as shown in FIG. 1B. Ideally, the CD of the feature (the width of the feature) is equal to the CD 116 of the feature in the photoresist 112. In practice, the CD of the feature 116 may be larger than the CD of the photoresist 112 due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

In the etching of conductive layers, such as in the formation of memory devices, it is desirable to increase device density without diminishing performance.

FIG. 2A is a cross-sectional view of a photoresist mask for producing conductive lines, when spacing between the lines is too close according to the prior art. Over a substrate 204, such as a wafer a barrier layer 206 may be placed. Over the barrier layer 206 a dielectric layer 208 such as a metal layer or a polysilicon layer is formed. Over the dielectric layer 208 an antireflective layer (ARL) 210 such as a DARC layer is formed. A photoresist mask 212a is formed over the ARL 210. In this example the line masks 214a have a width defined as the line width "L", as shown. The spaces 222 have a width "S", as shown. The pitch length "P" is defined as the sum of the line width and the space width P=L+S, as shown. It is desirable to reduce the pitch length.

One way of reducing pitch with is by reducing space width. FIG. 2B is a cross-sectional view of a photoresist mask for producing conductive or dielectric trench lines, when spacing between the lines is too close according to the prior art. Over a substrate 204, such as a wafer a barrier layer 206 may be placed. Over the barrier layer 206 a conductive or dielectric layer 208 such as a metal layer or a polysilicon layer or a dielectric layer is formed. Over the layer 208 an antireflective layer (ARL) 210 such as a DARC layer is formed. A photoresist mask 212 is formed over the ARL 210. In this example, the photoresist mask 212b forms line masks 214b with photoresist residue 218 formed in spaces between the line masks 214b. The presence of the photoresist residue 218 is caused by providing too small of a space between the line masks 214b, since it is more difficult to remove residue from a small space. This may limit the density of the conductive lines that may be provided.

SUMMARY OF THE INVENTION

To achieve the foregoing and in accordance with the purpose of the present invention a method for forming features in an etch layer is provided. A first mask is formed over the etch layer wherein the first mask defines a plurality of spaces with widths. A sidewall layer is formed over the first mask wherein the sidewall layer reduces the widths of the spaces defined by the first mask. Features are etched into the etch layer through the sidewall layer, wherein the features have widths that are smaller than the widths of the spaces defined by the first mask. The mask and sidewall layer are removed. An additional feature step is performed, by performing the following steps. An additional mask is formed over the etch layer wherein the additional mask defines a plurality of spaces with widths. A sidewall layer is formed over the additional mask, wherein the sidewall layer reduces the widths of the spaces defined by the additional mask. Features are etched into the etch layer through the sidewall layer, wherein the widths of the feature are smaller than the widths of the spaces defined by the first mask. The mask and sidewall layer are removed.

In another manifestation of the invention, a method for forming features in an etch layer is provided. A first mask is formed over the etch layer wherein the first mask defines a plurality of spaces with widths and wherein the plurality of spaces have a critical dimension and a pitch. A sidewall layer is formed over the first mask wherein the sidewall layer reduces the widths of the spaces defined by the first mask. Features are etched into the etch layer through the sidewall layer, wherein the widths and critical dimension of the spaces is at least 50% less than the widths of the spaces and critical dimension of the spaces in the first mask. The mask and sidewall layer are removed. An additional feature step is performed by the following steps. An additional mask is formed over the etch layer wherein the additional mask defines a plurality of spaces with widths and wherein the plurality of spaces have a critical dimension and a pitch. A sidewall layer is formed over the additional mask, wherein the sidewall layer reduces the widths of the spaces defined by the additional mask. Features are etched into the etch layer through the sidewall layer, wherein the widths and critical dimension of the features are at least 50% less than the widths of the spaces and critical dimension of the spaces in the first mask and wherein the features have a pitch which is at least 50% less than the pitch of the spaces in the first mask and the pitch of the spaces in the additional mask. The mask and sidewall layer are removed. Additional masks can reduce the CD even more. For example 3 masks can provide about 65% and 4 masks can provide 75% shrink, and so on.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention provides features with small critical dimensions (CD). More specifically, the invention provides a features with CD's that are less than the CD of the photoresist pattern used to etch the feature.

Figure 1A:
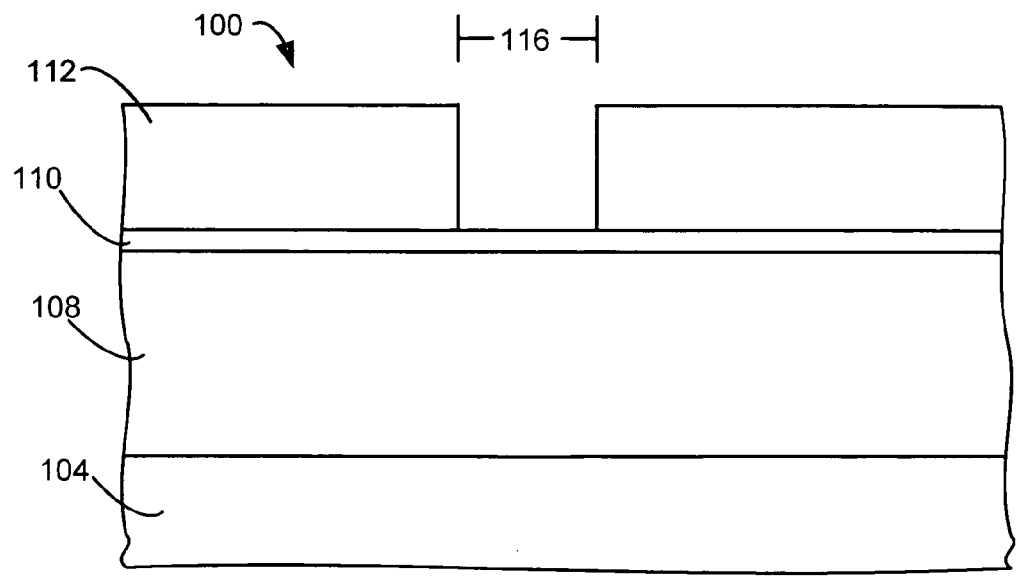
FIGS. 1A-B are schematic cross-sectional views of a stack etched according to the prior art.
Figure 1B:
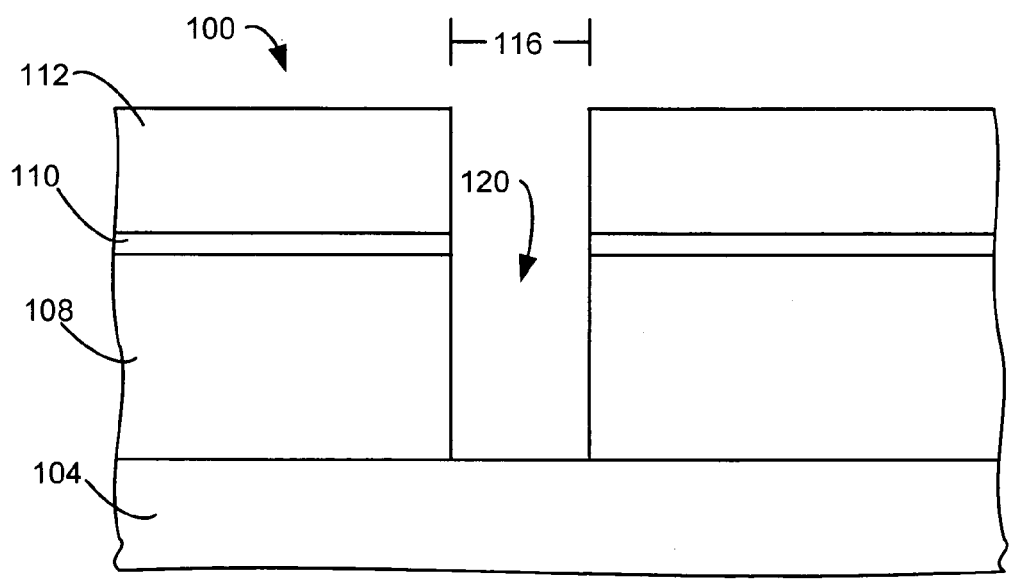
Figure 2:
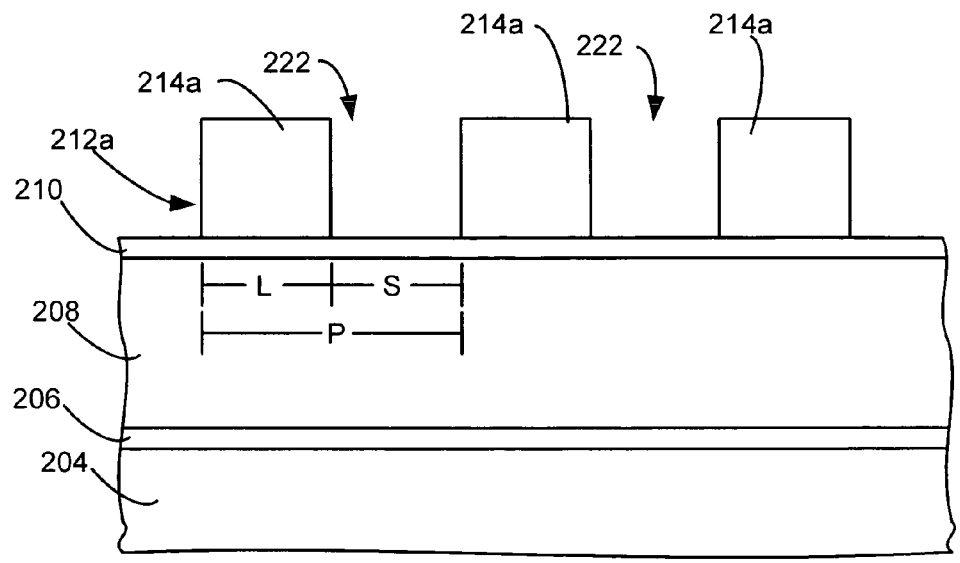
FIGS. 2A-B are schematic cross-sectional views of masks formed according to the prior art.
Figure 2:
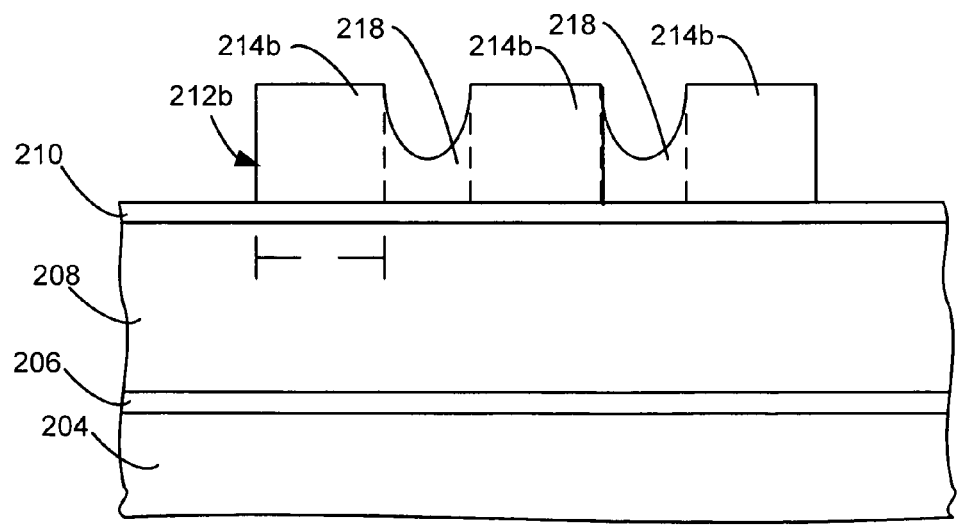
Figure 3:
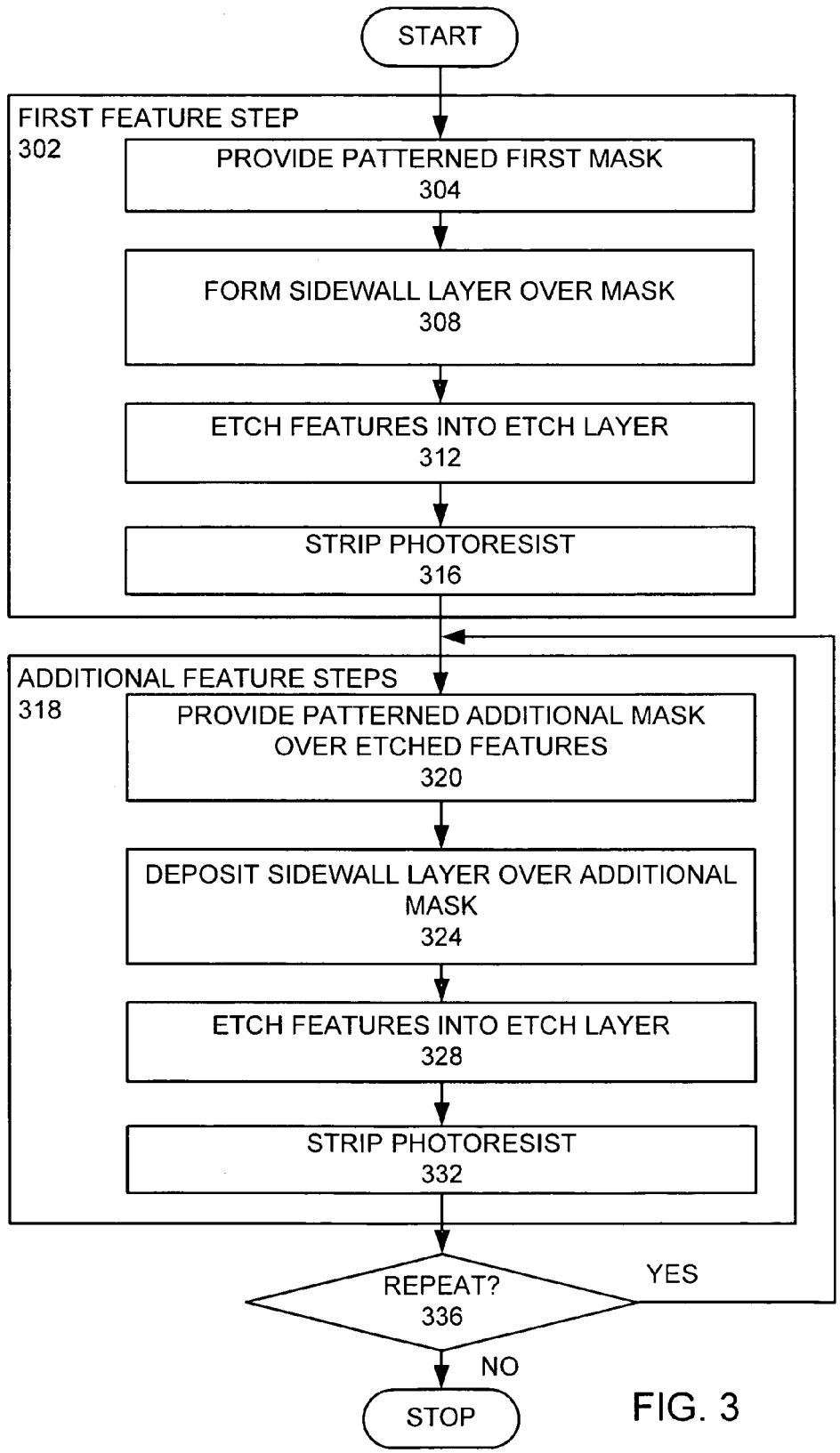
FIG. 3 is a high level flow chart of a process that may be used in an embodiment of the invention.
Figure 4:
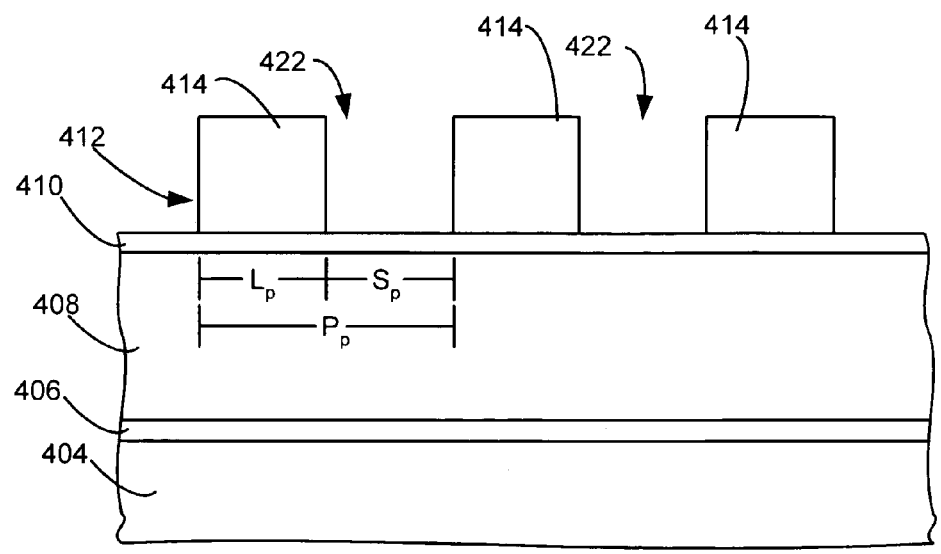
FIGS. 4A-H are schematic cross-sectional views of a stack processed according to an embodiment of the invention.
Figure 4:
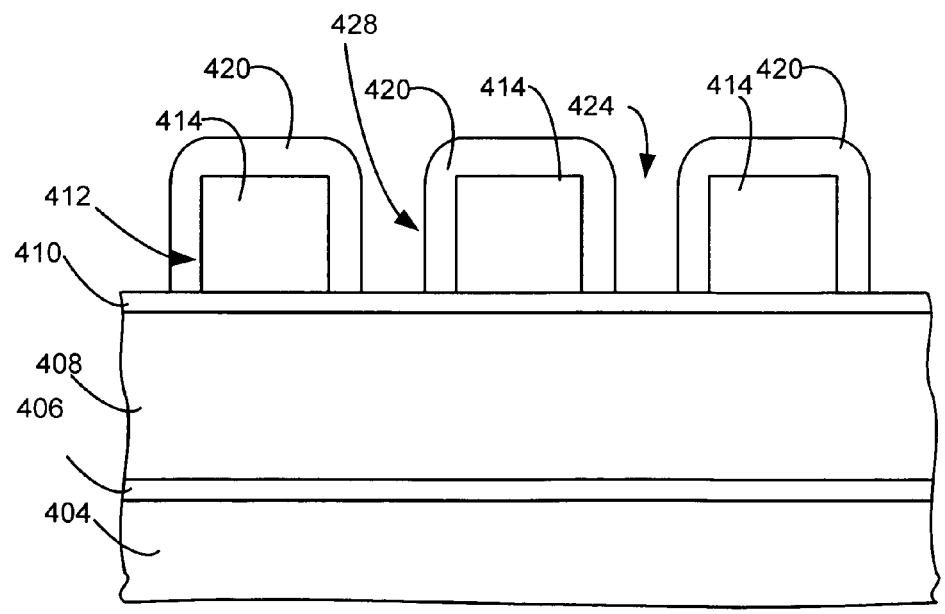
Figure 4:
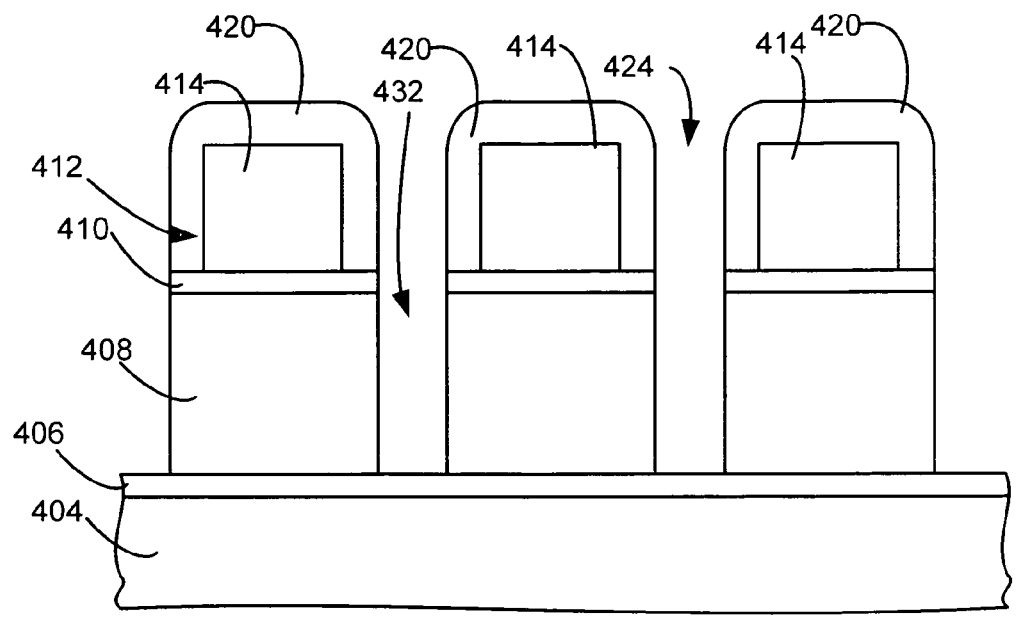
Figure 4:
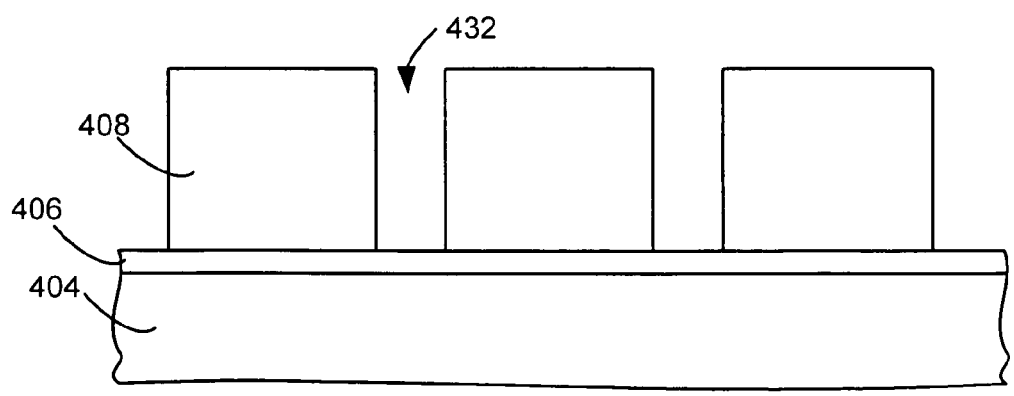
Figure 4:
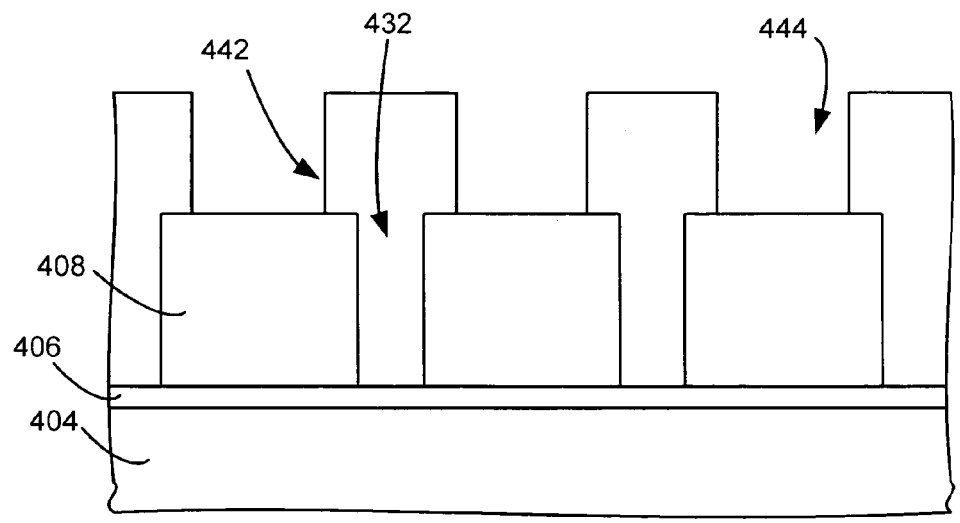
Figure 4:
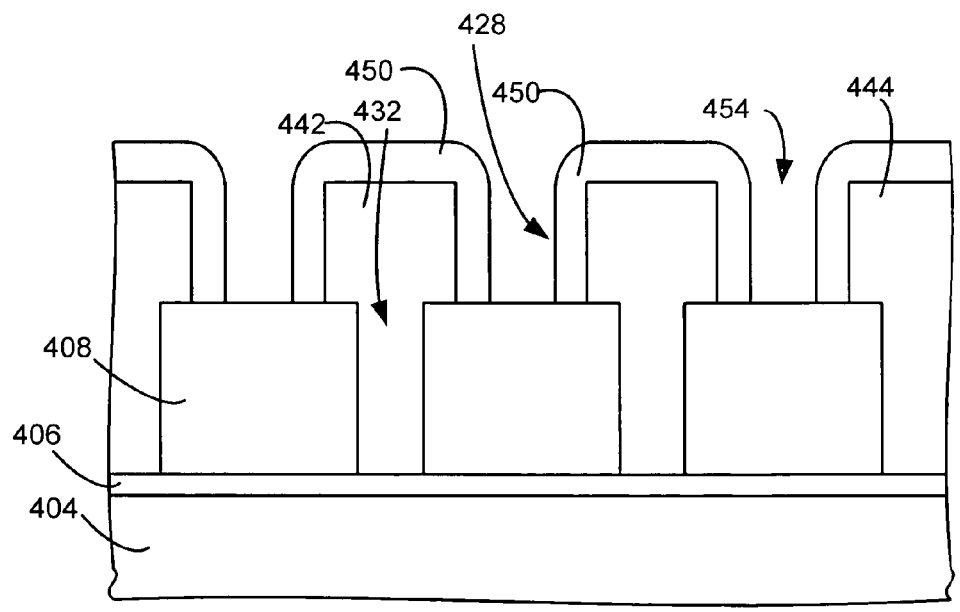
Figure 4:
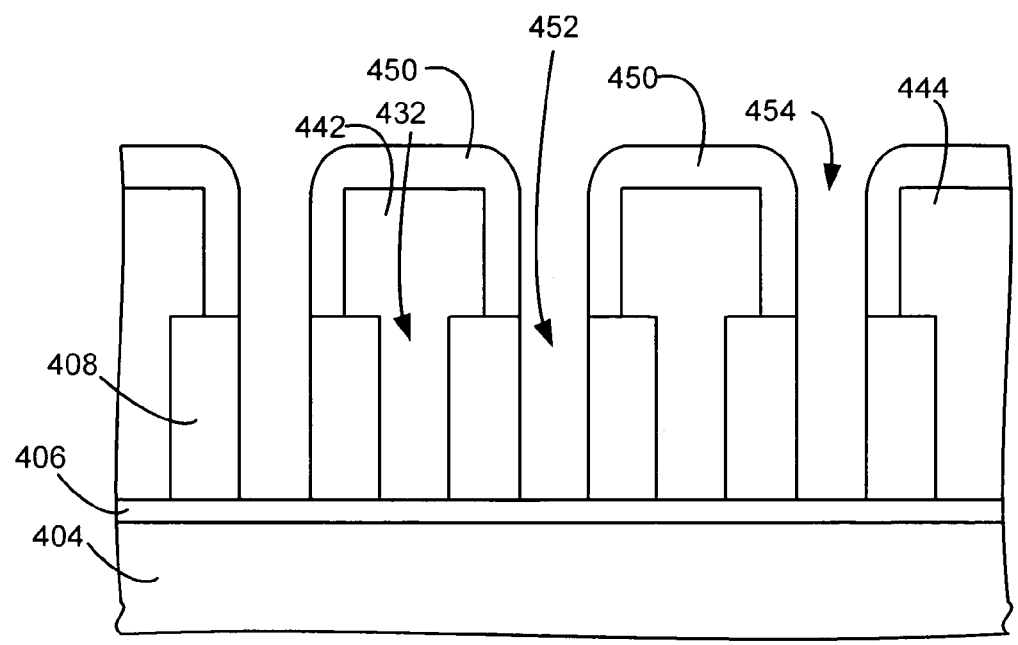
Figure 4:
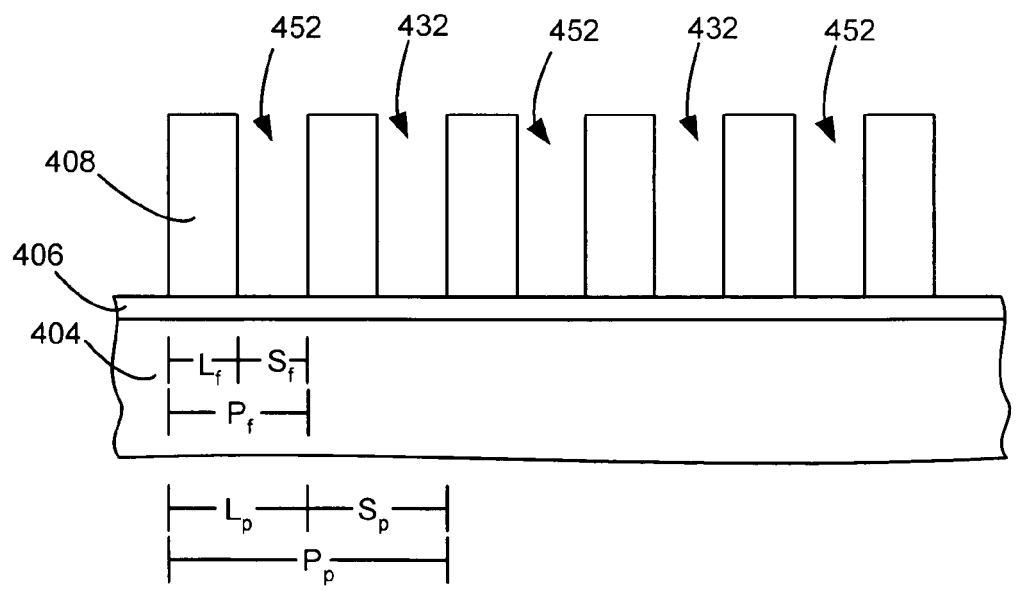

To facilitate understanding, FIG. 3 is a high level flow chart of a process that may be used in an embodiment of the invention. A first feature step is performed (step 302). A patterned first mask is provided (step 304). FIG. 4A is a cross-sectional view of a patterned mask in an embodiment of the invention. Over a substrate 404, such as a wafer a barrier layer 406 may be placed. Over the barrier layer 406 an etch layer 408 such as a conductive metal layer or a polysilicon layer or a dielectric layer is formed. Over the etch layer 408 an antireflective layer (ARL) 410 such as a DARC layer is formed. A patterned first mask 412 is formed over the ARL 410. In this example the line masks 414 have the a width defined as the line width "$L_p$", as shown. The spaces 422 in the photoresist mask have a width "$S_p$", as shown. The pitch length "$P_p$" of the photoresist mask is defined as the sum of the line width and the space width $P_p=L_p+S_p$, as shown. These widths are determined by the resolution of the lithographic techniques used to form the photoresist mask. It is desirable to reduce the pitch length.

A sidewall layer is formed over the mask to reduce the CD (step 308). FIG. 4B is a schematic cross-sectional view of the patterned first mask 412 with a sidewall layer 420 deposited over the sidewalls of the first mask. The sidewall layer 420 forms a sidewall layer feature 424 within the mask spaces, where the sidewall layer feature 424 has a reduced space CD that is less than the space CD of the first mask. Preferably, the reduced space CD of the deposited first mask is 50% less than the space CD of the first mask feature. It is also desirable that the sidewall layer has substantially vertical sidewalls 428, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching mask. Preferably, the deposition on the side wall is thicker than the deposition on the bottom of the first mask feature. More preferably, no layer is deposited over the bottom of the first mask feature.

A first set of features are then etched into the etch layer 408 through the sidewall layer spaces (step 312). FIG. 4C shows a first set of features 432 etched into the etch layer 408. In this example, the first set of features 432 etched in the etch layer 408 has a CD width, which is equal to the space CD of the deposited layer feature. In practice, the CD of the features of the first set of features 432 may be slightly larger than the CD of the feature of the deposited layer 420. However, since the CD of the deposited layer feature is significantly smaller than the CD of the photoresist 412, the CD of the features in the etch layer 408 is still smaller than the CD of the photoresist 412. If the CD of the deposited layer was only slightly smaller than the CD of the photoresist, or if the deposited layer was faceted or bread loafed, then the CD of the layer to be etched might not be smaller than the CD of the photoresist. In addition, a faceted or bread-loafing deposited layer may cause a faceted or irregularly shaped feature in the layer to be etched. It is also desirable to minimize deposition on the bottom of the photoresist feature. In this example, the CD of the features etched in the layer to be etched 408 is about 50% less than the CD of the photoresist feature.

The photoresist and deposited layer is then stripped (step 316). This may be done as a single step or two separate steps with a separate deposited layer removal step and photoresist strip step. Ashing may be used for the stripping process. FIG. 4D shows the substrate 400 after the deposited layer and photoresist mask have been removed. The first feature step (302) is completed.

The additional feature steps (step 318) are then performed. A patterned additional mask is formed over the etched features (step 320), which in this case is the first set of etched features. FIG. 4E shows the substrate 404, where a second photoresist mask 442 has been formed over the etch layer 408, wherein the second photoresist mask 442 covers the first set of features 432 and where spaces 444 in the second photoresist mask are formed between the first set of etched features 432.

A sidewall layer is then deposited over the sidewalls of the additional mask features to reduced the CD (step 324). FIG. 4F is a schematic cross-sectional view of the additional mask 442 with a sidewall layer 450 deposited over the sidewalls of the additional mask 442. The sidewall layer 450 forms a sidewall layer feature 454 within the mask space, where the sidewall layer feature 454 has a reduced space CD that is less than the space CD of the additional mask. Preferably, the reduced space of the sidewall layer feature is 50% less than the space CD of the additional mask feature. It is also desirable that the mask layer feature 422 has substantially vertical sidewalls, which are highly conformal as shown. An example of a substantially vertical sidewall is a sidewall that from bottom to top makes an angle of between 88° to 90° with the bottom of the feature. Preferably, the deposition on the side wall is thicker than the deposition on the bottom of the photoresist feature. More preferably, no layer is deposited over the bottom of the photoresist feature.

Features are etched into the etch layer (step 324) forming a second set of etch features 452 between the first set of etch features 432, as shown in FIG. 4G. The photoresist and deposited layer are then stripped (step 332), as shown in FIG. 4H. The line width of the etch layer is shown as $L_f$. The space width of the features in the etch layer is shown as $S_f$. The pitch length of the features is shown as $P_f$, where $P_f = L_f + S_f$. For comparison, photoresist mask pitch $P_p$, photoresist line width $L_p$, and photoresist spacing $S_p$ from FIG. 4A, are shown in FIG. 4G for comparison with feature pitch $P_f$, feature line width $L_f$, and feature space width $S_f$. In this embodiment, the length of the pitch for the features $P_f$ is half the length of the pitch of the photoresist mask $P_p$, since the line width between features $L_f$ is half of the line width of the photoresist mask $L_p$ and the feature space width $S_f$ is half of the space in the photoresist mask $S_p$. Therefore, the inventive process is able to use two masking steps to double etch feature resolution, by reducing pitch length, line width, and feature width by half, while using the same photoresist lithography process.

Since this embodiment uses only two masks, at the repeat step (step 336), it is determined that the process is not repeated.

Three Mask Example

Figure 5:
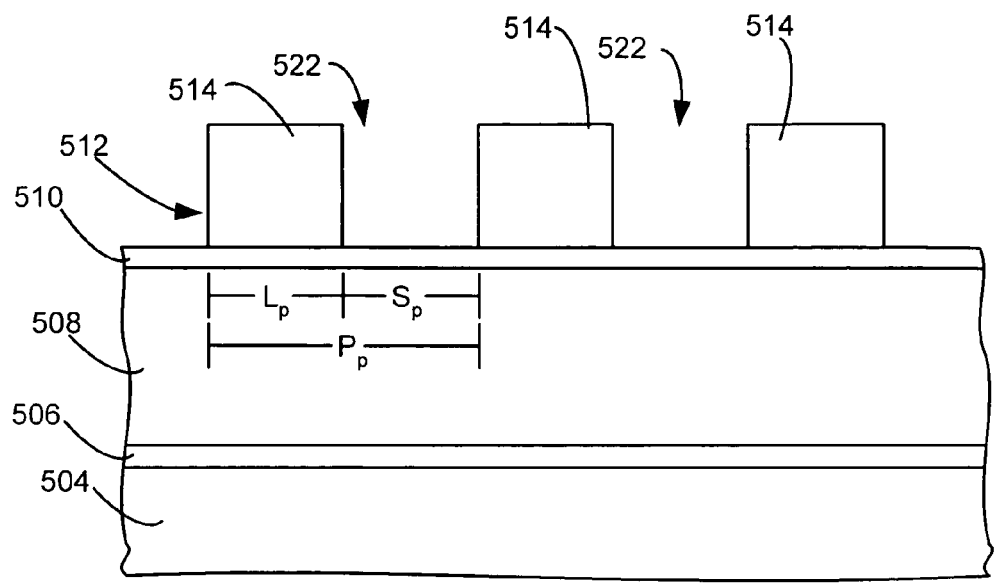
FIGS. 5A-F are schematic cross-sectional views of a stack processed according to another embodiment of the invention.
Figure 5:
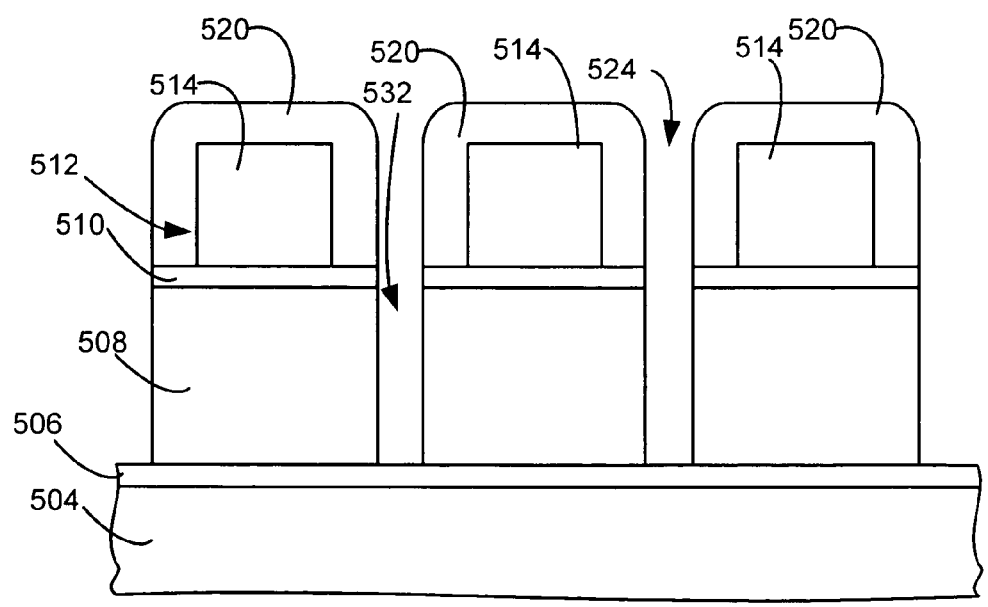
Figure 5:
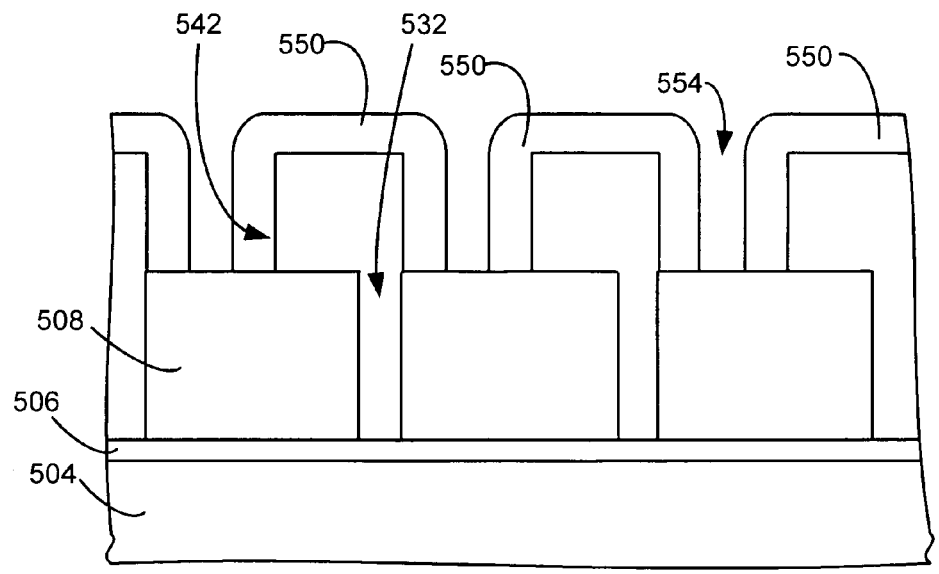
Figure 5:
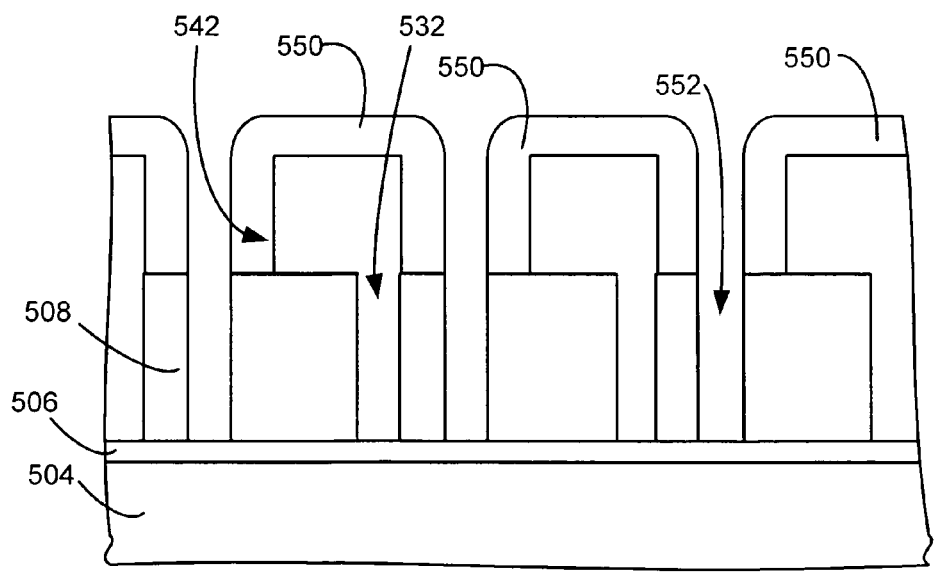
Figure 5:
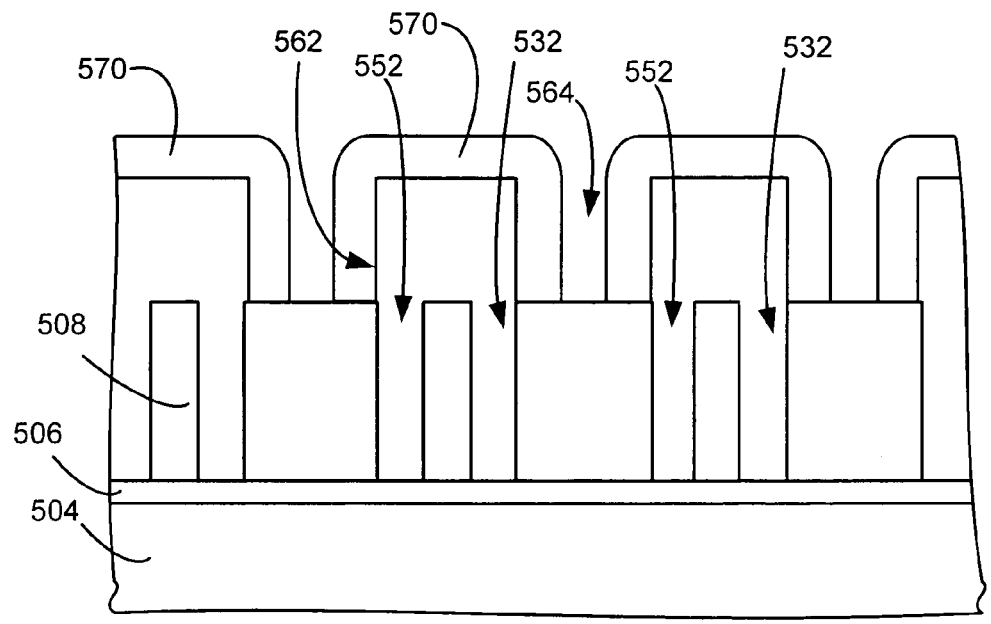
Figure 5:
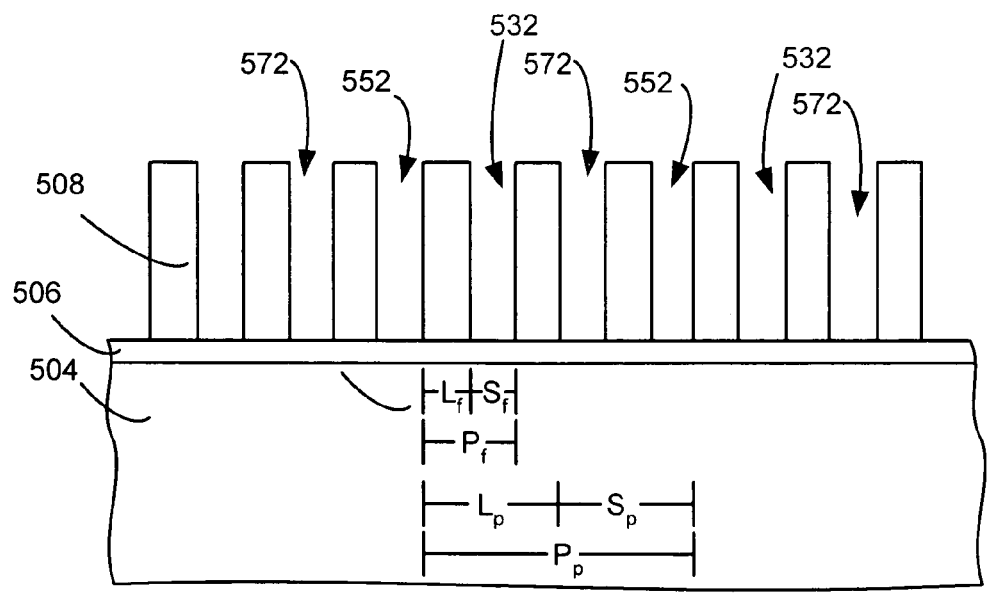

In another example, three mask process may be used the reduce pitch length, line width, and feature size by 67%. A first feature step is performed (step 302). A patterned photoresist mask is provided (step 304). FIG. 5A is a cross-sectional view of a photoresist mask in an embodiment of the invention. Over a substrate 504, such as a wafer a barrier layer 506 may be placed. Over the barrier layer 506 an etch layer 508, such as a metal layer or a polysilicon layer or a dielectric layer is formed. Over the etch layer 508 an antireflective layer (ARL) 510 such as a DARC layer is formed. A photoresist mask 512 is formed over the ARL 510. In this example the line masks 514 have the a width defined as the line width "$L_p$", as shown. The spaces 522 in the photoresist mask have a width "$S_p$", as shown. The pitch length "$P_p$" of the photoresist mask is defined as the sum of the line width and the space width $P_p = L_p + S_p$, as shown. These widths are determined by the resolution of the lithographic techniques used to form the photoresist mask. It is desirable to reduce the pitch length.

A sidewall layer is then deposited over the sidewalls of the photoresist features to reduced the CD (step 308). FIG. 5B is a schematic cross-sectional view of the patterned photoresist mask 512 with a sidewall layer 520 deposited over the sidewalls of the feature 514. The sidewall layer 520 forms a sidewall layer feature 524 within the photoresist feature 514, where the sidewall layer feature 524 has a reduced space CD that is less than the space CD of the photoresist feature. Preferably, the reduced space of the sidewall layer feature is at least 66% less than the space CD of the photoresist feature. It is also desirable that the sidewall layer feature has substantially vertical sidewalls, which are highly conformal as shown.

A first set of features are then etched into the etch layer 508 through the sidewall layer features (step 512). FIG. 5B shows a first set of features 532 etched into the etch layer 508. In this example, the first set of features 532 etched in the etch layer 508 has a CD width, which is equal to the space CD of the sidewall layer feature. In practice, the CD of the features of the first set of features 432 may be slightly larger than the CD of the feature of the sidewall layer 420. In this example, the CD of the features etched in the layer to be etched 508 is about 67% less than the CD of the photoresist feature.

The photoresist and sidewall layer is then stripped (step 316). This may be done as a single step or two separate steps with a separate sidewall layer removal step and photoresist strip step. Ashing may be used for the stripping process. The first feature step (302) is completed.

The additional feature steps (step 318) are then performed. A patterned photoresist mask is formed over the etched features (step 320), which in this case is the first set of etched features. FIG. 5C shows the substrate 504, where a second photoresist mask 542 has been formed over the etch layer 508, wherein the second photoresist mask 542 covers the first set of features 532 and where spaces 544 in the second photoresist mask are formed between the first set of etched features 532.

A sidewall layer 550 is then deposited over the sidewalls of the second photoresist features to reduced the CD (step 324). The sidewall layer 550 forms a sidewall layer feature within the photoresist feature, where the sidewall layer feature 554 has a reduced space CD that is less than the space CD of the photoresist feature. Preferably, the reduced space of the sidewall layer feature is about 66% less than the space CD of the photoresist feature. It is also desirable that the deposited layer feature has substantially vertical sidewalls, which are highly conformal as shown.

Features are etched into the etch layer (step 324) forming a second set of etch features 552, as shown in FIG. 5D. Each feature of the second set of features 552 is between two features of the first set of features 532, unless the feature of the second set of features 552 is at an end of the features. The photoresist and deposited layer are then stripped (step 332). The additional feature step (step 318) is completed.

A determination is then made on whether to repeat the additional feature steps (step 336). Since this process uses three masks and only two have been created, the additional feature step (step 318) is repeated. A patterned photoresist mask is formed over the etched features (step 320), which in this case is the first set and second set of etched features. FIG. 5E shows the substrate 504, where a third photoresist mask 562 has been formed over the etch layer 508, wherein the third photoresist mask 562 covers the first set of features 532 and the second set of features 552 and where spaces 564 in the third photoresist mask are formed between the first set of etched features 532 and the second set of etched features 552.

A sidewall layer 570 is then deposited over the sidewalls of the second photoresist features to reduced the CD (step 324). The sidewall layer 570 forms a sidewall layer feature within the photoresist feature, where the sidewall layer feature has a reduced space CD that is less than the space CD of the photoresist feature. Preferably, the reduced space of the sidewall layer feature is about 66% less than the space CD of the photoresist feature. It is also desirable that the sidewall layer feature has substantially vertical sidewalls, which are highly conformal as shown.

Features are etched into the etch layer (step 324) forming a third set of etch features 572, as shown in FIG. 5F. Each feature is of the third sent of etch features 572 is between a feature of the second set of features 552 and a feature of the first set of features 532, unless that feature of the third set of features is at an end. The photoresist and deposited layer are then stripped (step 332). The additional feature step (step 318) is completed. Since this is the third mask of a three mask process, the repeat condition (step 336) is answered as "no" and the process is stopped.

The line width of the etch layer is shown as $L_f$. The space width of the features in the etch layer is shown as $S_f$. The pitch length of the features is shown as $P_f$, where $P_f = L_f + S_f$. For comparison, photoresist mask pitch length $P_p$, photoresist line width $L_p$, and photoresist spacing $S_p$ from FIG. 5A, are shown in FIG. 5G for comparison with feature pitch length $P_f$, feature line width $L_f$, and feature space width $S_f$. In this embodiment, the length of the pitch for the features $P_f$ is ⅓ the pitch length of the photoresist mask $P_p$, since the line width between features $L_f$ is ⅓ of the line width of the photoresist mask $L_p$ and the feature space width $S_f$ is ⅓ of the space in the photoresist mask $S_p$. Therefore, the inventive process is able to use three masking steps to triple etch feature resolution, by reducing pitch length, line width, and feature width by ⅓, while using the same photoresist lithography process.

Theoretically, n masks may be used to increase resolution by a factor of n.

Using Gas Modulation to Form Sidewalls

In the preferred embodiment, gas modulation is used to form the conformal sidewalls. Preferably the sidewalls are formed of a polymer material and the mask is a photoresist polymer, so that the deposition of the sidewall layer may be performed in situ in the same chamber were the etching and stripping are performed, and so that the stripping may remove both the mask and the sidewall layer.

Figure 6:
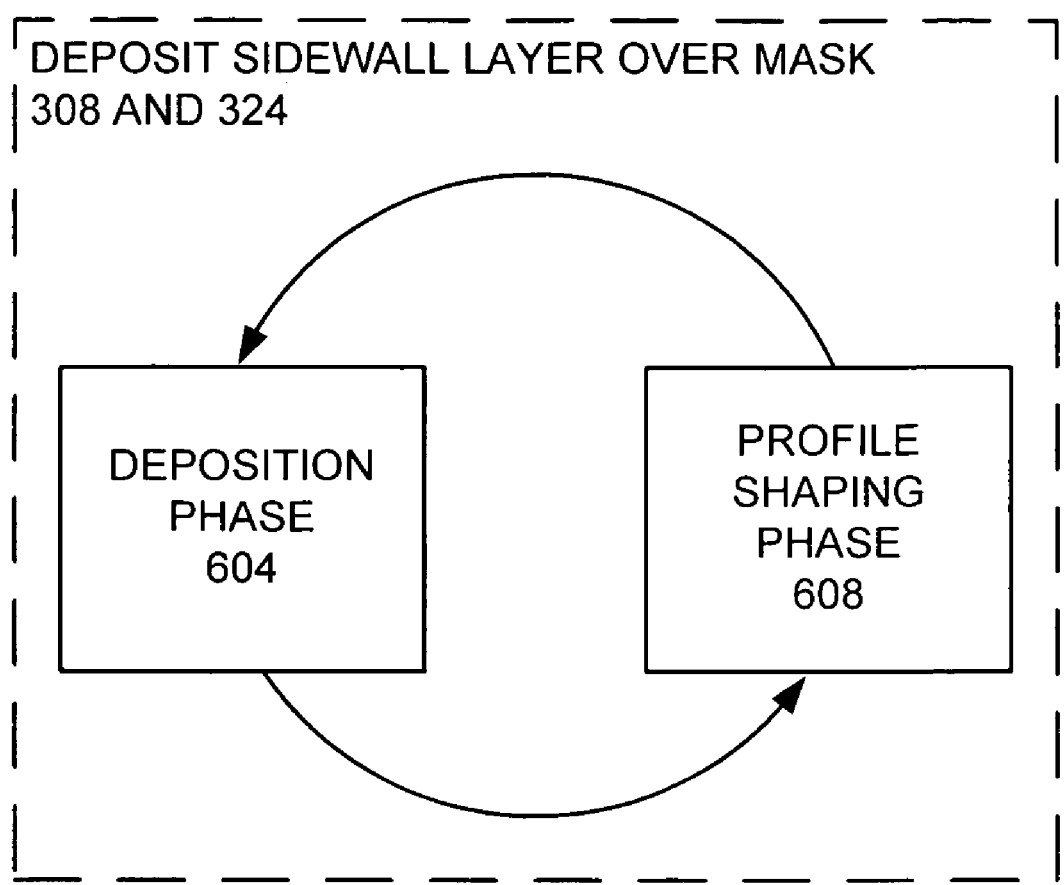
FIG. 6 is a more detailed flow chart of the step of depositing a sidewall layer.

FIG. 6 is a more detailed flow chart of the forming a sidewall layer over the mask to reduce CD (steps 308 and 324), which uses gas modulation. In this embodiment, the forming the sidewall layer over the mask to reduce CD (steps 308 and 324) comprises a deposition phase 604 and a profile shaping phase 608. The deposition phase uses a first gas chemistry to form a plasma, which deposits a sidewall layer over the sidewalls of the mask.

The invention may be used for etching a dielectric layer or a conductive layer. Example recipes that may be used to practice the invention for dielectric or conductive layers are provided below:

Example of Dielectric Etch

Figure 7:
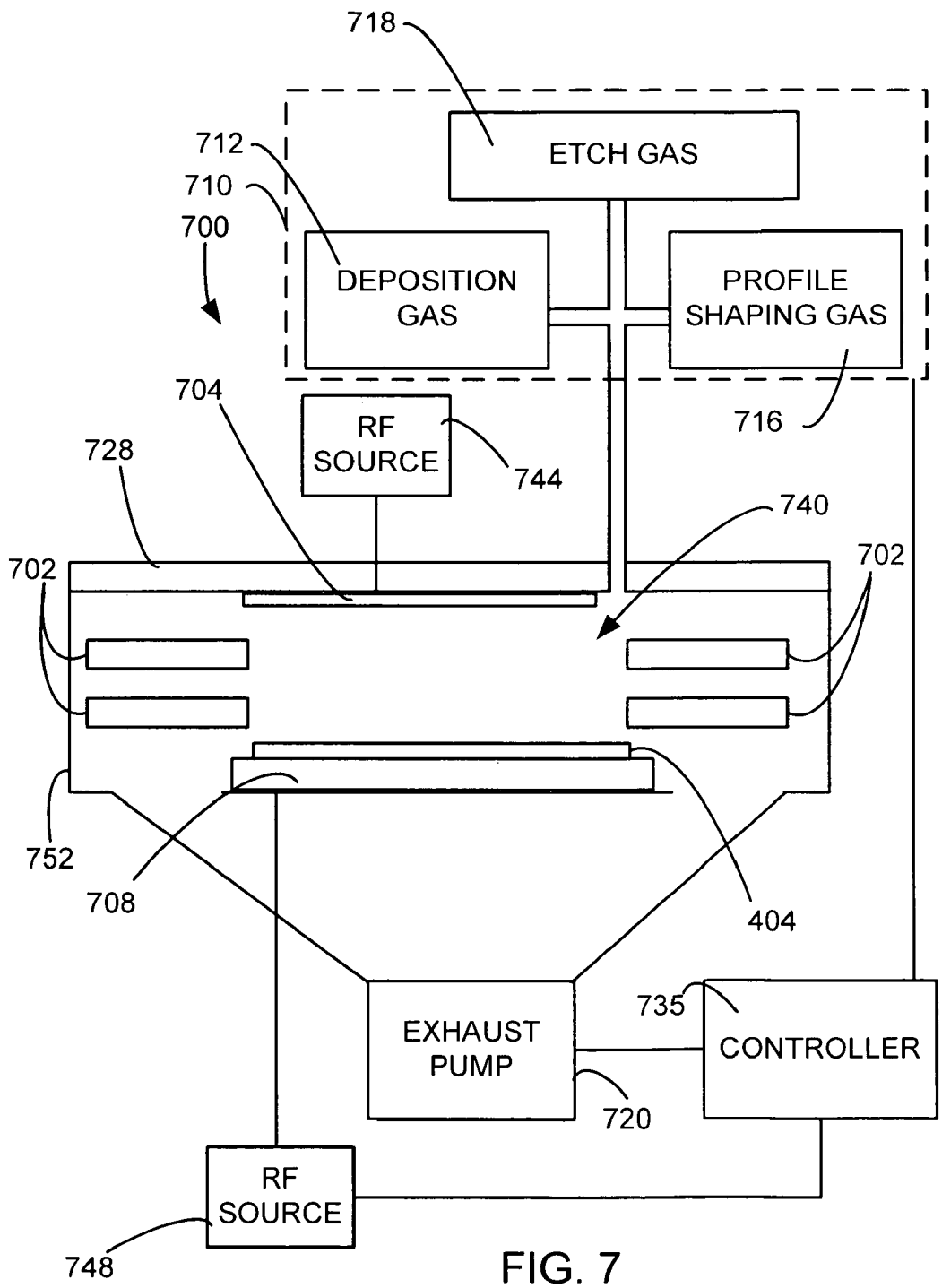
FIG. 7 is a schematic view of a plasma processing chamber that may be used in practicing the invention.

FIG. 7 is a schematic view of a plasma processing chamber 700 that may be used for depositing the sidewall layer, etching, and stripping. The plasma processing chamber 700 comprises confinement rings 702, an upper electrode 704, a lower electrode 708, a gas source 710, and an exhaust pump 720. Tile gas source 710 comprises a deposition gas source 712 and a profile shaping gas source 716. The gas source 710 may comprise additional gas sources, such as an etching gas source 718. Within plasma processing chamber 700, the substrate 404 is positioned upon the lower electrode 708. The lower electrode 708 incorporates a suitable substrate chucking mechanism (e.g., electrostatic, mechanical clamping, or the like) for holding the substrate 404. The reactor top 728 incorporates the upper electrode 704 disposed immediately opposite the lower electrode 708. The upper electrode 704, lower electrode 708, and confinement rings 702 define the confined plasma volume. Gas is supplied to the confined plasma volume by the gas source 710 and is exhausted from the confined plasma volume through the confinement rings 702 and an exhaust port by the exhaust pump 720. A first RF source 744 is electrically connected to the upper or lower electrode 704. A second RF source 748 is electrically connected to the lower electrode 708. Chamber walls 752 surround the confinement rings 702, the upper electrode 704, and the lower electrode 708. Both the first RF source 744 and the second RF source 748 may comprise a high requency (27 to 300) MHz power source and a low frequency (2 to 14) MHz power source. Different combinations of connecting RF power to the electrode are possible. A controller 735 is controllably connected to the RF sources 744, 748, exhaust pump 720, and the gas source 710.

Figure 8A:
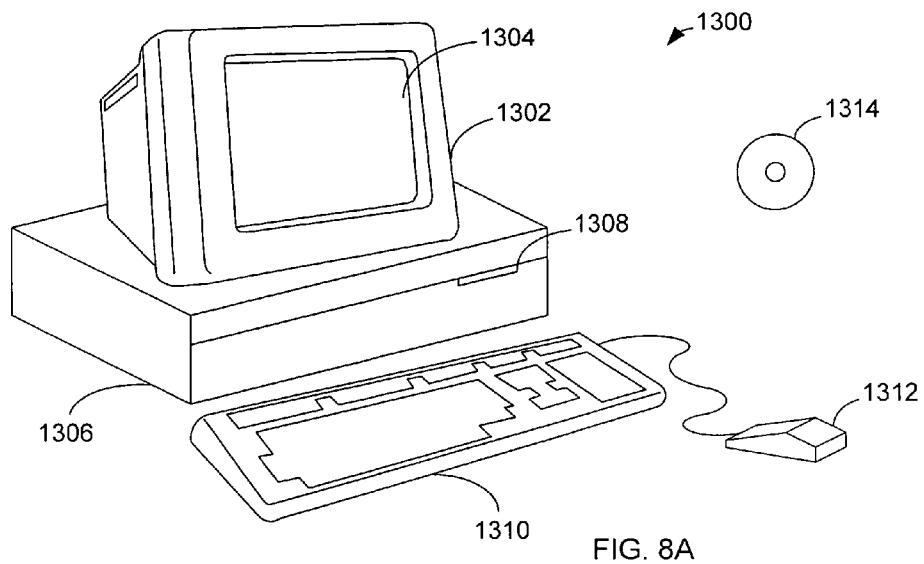
FIGS. 8A-B illustrate a computer system, which is suitable for implementing a controller used in embodiments of the present invention.
Figure 8B:
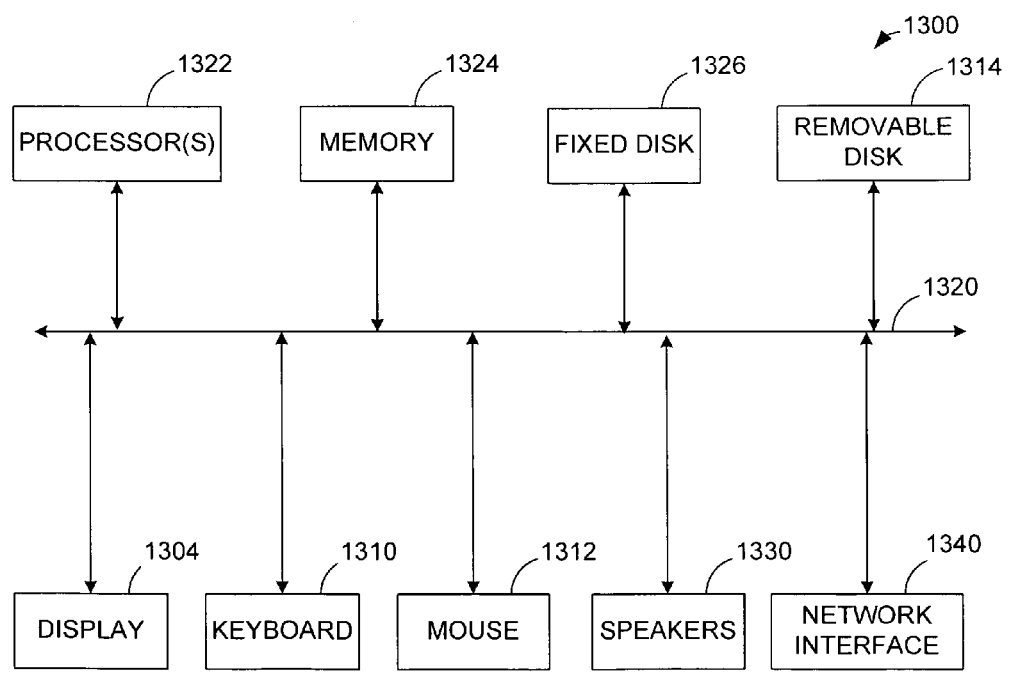

FIGS. 8A and 8B illustrate a computer system 1300, which is suitable for implementing a controller 735 used in embodiments of the present invention. FIG. 8A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 8B is an example of a block diagram for computer system 1300. Attached to system bus 1320 is a wide variety of subsystems. Processor(s) 1 322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these or other types of memories may include any suitable form of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1 326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330, and feedback and forward system for control of the process. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Other examples may use other deposition devices.

One example of a deposition phase 604 may be $CH_3F$ deposition using a chemistry of 250 sccm (standard cubic centimeters per minute) Ar and 50 sccm $CH_3F$, at a pressure of 60 mTorr, established by setting a Vat valve of the turbo pump to 1000. The 27 MHz RF source provides 500 Watts of power, while the 2 MHz RF source provides 100 Watts of power. The chamber temperature is maintained at 20° C. A helium cooling pressure, to cool the substrate is 15 Torr. Such a recipe causes the formation of a polymer sidewall layer.

One example of a profile shaping phase 608 may be $C_4F_6/O_2/CO$ deposition using a chemistry of 270 sccm Ar, 12 sccm $C_4F_6$, 8 sccm $O_2$, and 100 sccm CO, at a pressure of 50 mTorr, established by setting a Vat valve of the turbo pump to 1000. The 27 MHz RF source provides 1500 Watts of power, while the 2 MHz RF source provides 480 Watts of power. The chamber temperature is maintained at 20° C. A helium cooling pressure, to cool the substrate is 15 Torr.

Figure 9:
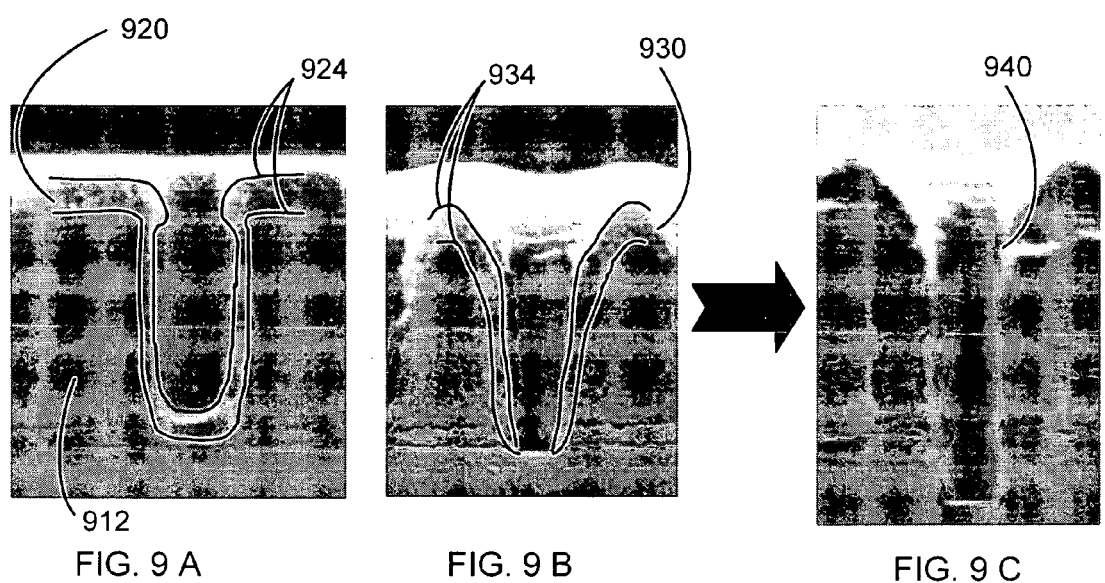
FIGS. 9A-C are cross-sectional views of depositions.

FIG. 9A is a cross-sectional view of a deposition layer 920 from the deposition phase. The deposition layer 920 is formed over a mask 912. In this example, the deposition phase forms a "bread-loafing" deposition layer as indicated by outlines 924. The bread-loafing deposition layer is characterized by a thicker sidewall deposition near the top of the feature and a thinner (or no) sidewall deposition near the bottom of the feature. In addition, the bread-loafing in this example forms a layer at over the very bottom surface of the feature, as shown. Therefore, this deposition provides a non-conformal sidewall deposition. Such a deposition does not provide the desired substantially vertical sidewalls. The bread-loafing eventually pinches off the top, which then cannot be used as a masking layer, since the contact will be closed off and no etching can be done.

FIG. 9B is a cross-sectional view of a deposition layer 930 where only the profiling shaping phase is used. In this example, the profile shaping phase forms a "faceting" deposition layer, as indicated by outlines 934. The faceting deposition layer is characterized by a thinner (or no) sidewall deposition near the top of the feature and a thicker sidewall deposition near the bottom of the feature. The "faceting" deposition does not deposit at the very bottom surface of the feature. Therefore, this deposition also provides a non-conformal sidewall deposition. If the sidewalls near the top are too thin, faceting of the photoresist mask may result. Such a deposition does not provide the desired substantially vertical sidewalls. The faceting of the corners of the photoresist mask may cause lower etch selectivity and fast mask erosion. The faceting of the mask will also result in faceting of the etched profile. In almost all cases, once the mask is faceted, then the final etched profile is also faceted, since the mask vertical profile generally translates into the etched material.

FIG. 9C is a cross-sectional view of a deposition layer 940 formed by 6 cycles of a 2 second deposition and 25 second profile shaping. As can be seen, the deposition layer has vertical sidewalls and little or no deposition at the bottom surface of the feature. To provide a 6 cycle process of multiple phases, a gas-modulation device, which is able to alternate gas recipes quickly, would be a preferred apparatus.

The ability to control the ratio of the times of the deposition phase 604 and the profile shaping phase 608 provide another control variable. A proper ratio will provide substantially vertical and conformal sidewalls as illustrated in FIG. 9C. Such a deposition layer is also able to protect the photoresist mask to increase etch selectivity. Other control parameters provided by the invention that can be used to control the deposition profiles are: number of cycles, total deposition time, deposition/shaping phase time ratio, gas chemistry types and ratios (such as $CH_3F/O_2$, $C_4F_6/O_2$, CH2F2, CHF3, CF4, H2, CH4, C2H4, SiH4, etc. ). Preferably, the deposition phase uses a chemistry of a hydrocarbon and a fluorocarbon. Preferably, the hydrocarbon is at least one of $CH_4$ and $C_2H_4$. The fluorocarbon is preferably at least on of $CH_3F$, $CH_2F_2$, $CHF_3$, $C_4F_6$, and $C_4F_8$. Other gas mixtures that may preferably be used during the deposition phase are $CF_4$ and $H_2$. Preferably, the profile shaping phase uses a chemistry of a fluorocarbon with or without other additives. Preferably, the fluorocarbon is at least one of $CH_2F_2$, $CHF_3$, and $CF_4$. Preferably, the other additive is at least one of Ar, Xe, He, Ne, $O_2$, $N_2$, and $H_2$.

The multiphase deposition allows a profile shaping step to remove unwanted deposition. In addition, a single long deposition may cause blistering. Preferably, the profile shaping step also densifies the polymer by bombarding the polymer with ions. Using multiple cycles for forming the deposition layers also provides finer CD control. In addition, the multiple cycle multiple phase deposition provides profile control. The reduction of bread loafing reduces shading, which improves etch profiles. In addition, the multiple cycle, multiple phase deposition reduces line wiggling, which is caused by the stress of a deposition layer, which causes the photoresist lines to wiggle. In addition, the profile shaping step prevents or reduces deposition on the bottom of the mask feature, to prevent residue from the deposition, which would come from resputtered material from the deposition layer that would be at the bottom of the mask feature.

Preferably, at least two cycles are used in the forming the deposition layer. More preferably, at least six cycles are used in forming the deposition layer. The number of cycles depend on the amount of CD reduction and is not limited to 2, or 6.

The ability to form features with smaller critical dimensions, without changing the photoresist, allows for smaller features without purchasing new lithography equipment. If newer generations of photoresist are used, the invention provides small CD's for the newer generations of photoresist, allowing for extension of the newer lithography and photoresist systems.

In other embodiments, three or more different gas chemistries may be used providing three or more different deposition or etch phases in forming the sidewall layer.

Example of Conductive Layer Etch

Figure 10:
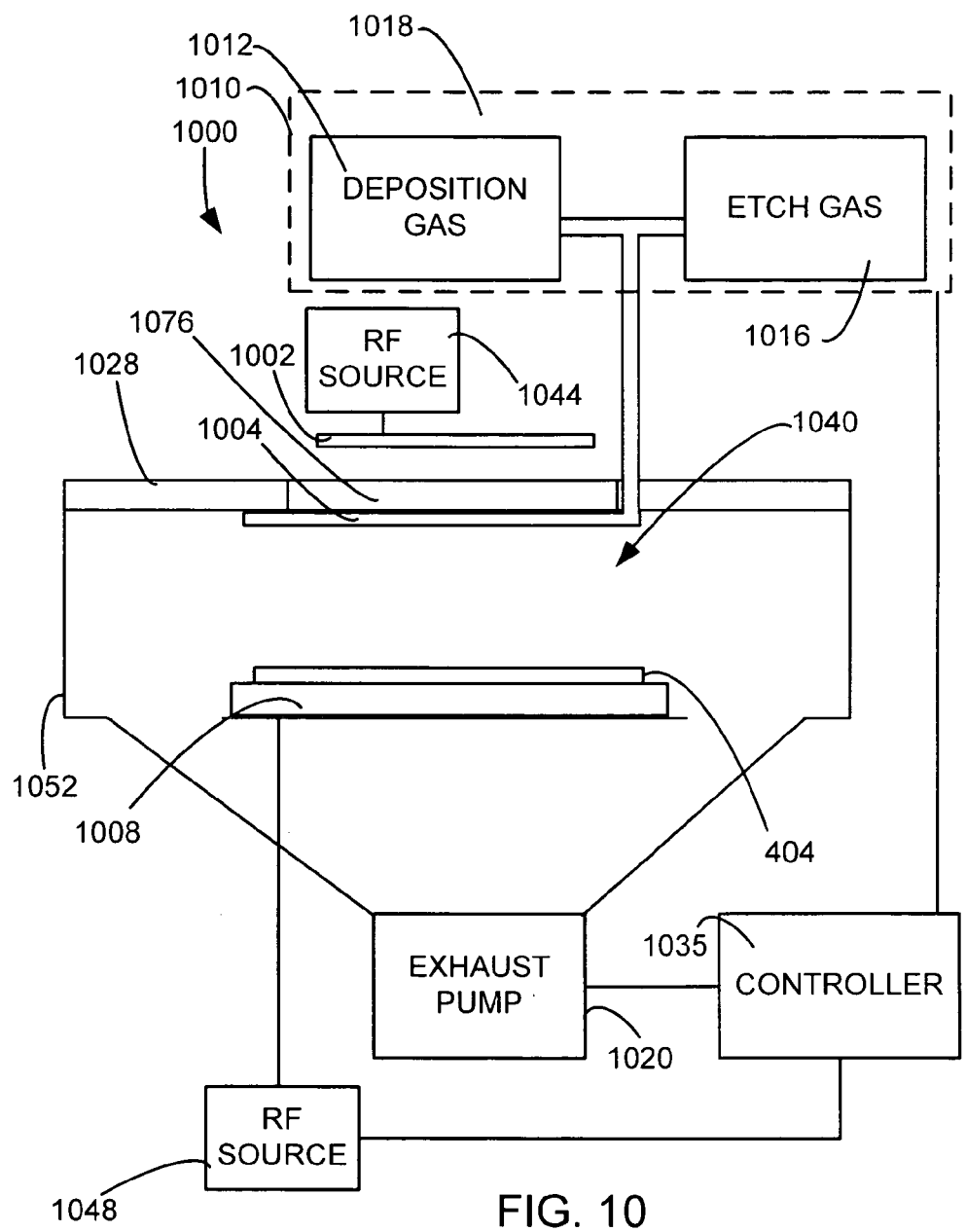
FIG. 10 is a schematic illustration of a device that may be used for practicing the invention for etching conductive layers.

An example recipe, a device that may be used for both depositing and etching the sidewall layer and the conductive layer is illustrated in FIG. 10. FIG. 10 is a schematic illustration of such a device 1000 used for both depositing and shaping the deposition layer. The plasma processing chamber 1000 comprises an inductive antenna (or coil) 1002, a gas distribution plate (GDP) 1004, a substrate support 1008, a gas source 1010, and an exhaust pump 1020. The gas source 1010 is in fluid connection with the gas distribution plate 1004 and comprises a deposition gas source 1012 and an etch gas source 1016. The gas source 101 0 may comprise additional gas sources, such as a second etching or deposition gas source. Within plasma processing chamber 1000, the substrate 404 is positioned upon the substrate support 1008. The substrate support 1008 incorporates a suitable substrate chucking mechanism (e.g., electrostatic, mechanical clamping, or the like) for holding the substrate 404. The reactor top 1028 incorporates a quartz dielectric window 1076, which allows the transmission of energy from the antenna 1002 into the chamber. The dielectric window 1076, the substrate support 1008, and anodized aluminum chamber walls 1052 define the confined plasma volume. Gas is supplied to the confined plasma volume by the gas source 1010 and is exhausted from the confined plasma volume through an exhaust port by the exhaust pump 1020. A first RF source 1044 is electrically connected to the antenna. A second RF source 1048 is electrically connected to the substrate support 1008. In this example, the first RF source 1044 provides a signal with a 13.56 MHz frequency, and the second RF source 1048 provides a signal with a 13.56 MHz frequency.

Other embodiments may use a hardmask for the mask. In such embodiments, a photoresist mask may be used to open a hardmask. The sidewall layer may be placed over the hardmask to reduce the spacing. In the alternative, the sidewall layer may be placed over the photoresist before etching the hardmask.

The invention also allows research into devices that are several generations beyond current devices. Lithography systems may not be available to create such devices. The invention allows a current lithography system to provide a device that is several generations smaller than the current lithography device, allowing the production of devices with critical dimensions that were considered beyond the reach of current lithography devices.

Spaces in the mask may be used to etch holes or trenches in the etch layer.

The invention may be used on many different types of plasma processing tools such as Exelan and TCP type etcher, hybrid PVD, CVD, MW, RIE, MORIE, TCP, ICP, etc.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming features in an etch layer, comprising:
   forming a first mask over the etch layer wherein the first mask defines a plurality of spaces with widths and a first pitch;
   forming a sidewall layer over the first mask wherein the sidewall layer reduces the widths of the spaces defined by the first mask, wherein the forming sidewall layer over the first mask comprises at least two cycles, wherein each cycle comprises:
      a deposition phase with a first gas chemistry to form a deposition plasma to form a deposition over the sidewalls of the first mask; and
      a profile shaping phase with a second gas chemistry to shape the profile of the deposition over the sidewalls of the first mask, wherein the first gas chemistry is different than the second gas chemistry;
   etching features into the etch layer through the sidewall layer, wherein the features have widths that are smaller than the widths of the spaces defined by the first mask;
   removing the mask and sidewall layer; and
   performing an additional feature step, comprising:
      forming an additional mask over the etch layer wherein the additional mask defines a plurality of spaces with widths;
      forming a sidewall layer over the additional mask, wherein the sidewall layer reduces the widths of the spaces defined by the additional mask;
      etching features into the etch layer through the sidewall layer, wherein the features have widths that are smaller than the widths of the spaces defined by the additional mask, wherein the features further have a second pitch smaller than the first pitch; and
      removing the mask and sidewall layer.

2. The method, as recited in claim 1, further comprising repeating the additional feature step at least once.

3. The method, as recited in claim 1, wherein the forming the sidewall layer over the additional mask is at least one cycle, wherein the cycle comprises:
   a deposition phase with a third gas chemistry to form a deposition plasma to form a deposition over the sidewalls of the additional mask; and
   a profile shaping phase with a fourth gas chemistry to shape the profile of the deposition over the sidewalls of the additional mask, wherein the third gas chemistry is different than the fourth gas chemistry.

4. The method, as recited in claim 3, wherein the forming the sidewall layers over the additional mask is performed for at least two cycles.

5. The method, as recited in claim 4, wherein the forming the sidewall layer forms sidewalls having an angle from bottom to top of between 88 degrees and 90 degrees.

6. The method, as recited in claim 4, further comprising placing the etch layer in a plasma processing chamber wherein the forming the sidewall layer and etching is done within the plasma processing chamber.

7. The method, as recited in claim 4, wherein the first mask and additional mask are photoresist masks, and wherein the sidewall layers are formed from a polymer material.

8. The method, as recited in claim 7, further comprising stripping the photoresist mask and sidewall layer with a single stripping step.

9. The method, as recited in claim 8, wherein the stripping the photoresist mask and sidewall layer comprises ashing the photoresist mask and sidewall layer.

10. The method, as recited in claim 9, wherein the ashing the photoresist mask and sidewall layer is performed in the same plasma processing chamber as forming the sidewall layer and etching.

11. The method, as recited in claim 4, wherein the forming the sidewall layer forms a sidewall layer that has a sidewall thickness and a photoresist feature bottom thickness, wherein the sidewall thickness is greater than a photoresist feature bottom thickness.

12. The method, as recited in claim 4, wherein the deposition phase produces a thicker sidewall deposition near the top of each sidewall and a thinner or no sidewall deposition near the bottom of each sidewall.

13. The method, as recited in claim 4, wherein the widths of the features are at least 50% less than the width of the spaces defined by the first mask.

14. The method, as recited in claim 4, wherein the spaces in the first mask have a pitch length and wherein the features formed in the etch layer have a pitch length that is at least 50% less than the pitch length of the spaces defined by the first mask.

15. A semiconductor device formed by the method of claim 1.

16. A method for forming features in an etch layer, comprising:
   forming a first mask over the etch layer wherein the first mask defines a plurality of spaces with widths and wherein the plurality of spaces have a critical dimension and a pitch;
   forming a sidewall layer over the first mask wherein the sidewall layer reduces the widths of the spaces defined by the first mask, wherein the forming sidewall layer over the first mask comprises at least two cycles, wherein each cycle comprises:
      a deposition phase with a first gas chemistry to form a deposition plasma to form a deposition over the sidewalls of the first mask; and
      a profile shaping phase with a second gas chemistry to shape the profile of the deposition over the sidewalls of the first mask, wherein the first gas chemistry is different than the second gas chemistry;
   etching features into the etch layer through the sidewall layer, wherein the features have widths and a critical dimension, wherein the feature widths are at least 50% less than the widths of the spaces in the first mask and the critical dimension of the features is at least 50% less than the critical dimension of the spaces in the first mask;
   removing the mask and sidewall layer; and
   performing an additional feature step, comprising:
      forming an additional mask over the etch layer wherein the additional mask defines a plurality of spaces with widths and wherein the plurality of spaces have a critical dimension and a pitch;
      forming a sidewall layer over the additional mask, wherein the sidewall layer reduces the widths of the spaces defined by the additional mask;
      etching additional features into the etch layer through the sidewall layer, wherein the additional features have widths and a critical dimension, wherein the widths of the additional features are at least 50% less than the widths of the spaces in the additional mask and the critical dimension of the additional features is at least 50% less than the critical dimension of the spaces in the additional mask and wherein the features and additional features have a pitch which is at least 50% less than the pitch of the spaces in the first mask and the pitch of the spaces in the additional mask; and
      removing the mask and sidewall layer.

17. The method, as recited in claim 16, wherein the forming sidewall layer over the additional mask comprises at least two cycles, wherein each cycle comprises:
   a deposition phase with a third gas chemistry to form a deposition plasma to form a deposition over the sidewalls of the additional mask; and
   a profile shaping phase with a fourth gas chemistry to shape the profile of the deposition over the sidewalls of the additional mask, wherein the third gas chemistry is different than the fourth gas chemistry.

18. The method, as recited in claim 17, further comprising placing the etch layer in a plasma processing chamber wherein the forming the sidewall layer, etching, and removing the mask and sidewall layer is done within the plasma processing chamber.

19. The method, as recited in claim 18, wherein the first mask is a photoresist mask and wherein the sidewall layer is of a polymer material.

20. The method, as recited in claim 19, wherein a hardmask is placed between the photoresist mask and the layer to be etched.

21. The method of claim 1, wherein said additional mask covers previously formed features.

* * * * *